(12) United States Patent
Purcell et al.

(10) Patent No.: US 10,366,036 B2
(45) Date of Patent: Jul. 30, 2019

(54) FLEXIBLE INPUT/OUTPUT ZONE IN A SERVER CHASSIS

(71) Applicant: HEWLETT PACKARD ENTERPRISE DEVELOPMENT LP, Houston, TX (US)

(72) Inventors: Brian T. Purcell, Tomball, TX (US); David M. Koonce, Cypress, TX (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 79 days.

(21) Appl. No.: 15/116,671

(22) PCT Filed: Apr. 4, 2014

(86) PCT No.: PCT/US2014/032950
§ 371 (c)(1),
(2) Date: Aug. 4, 2016

(87) PCT Pub. No.: WO2015/152940
PCT Pub. Date: Oct. 8, 2015

(65) Prior Publication Data
US 2016/0350255 A1    Dec. 1, 2016

(51) Int. Cl.
*G06F 13/20* (2006.01)
*G06F 13/42* (2006.01)
(Continued)

(52) U.S. Cl.
CPC ............ *G06F 13/4081* (2013.01); *G06F 1/16* (2013.01); *G06F 13/20* (2013.01);
(Continued)

(58) Field of Classification Search
None
See application file for complete search history.

(56) References Cited

U.S. PATENT DOCUMENTS

| 6,456,498 | B1 | 9/2002 | Larson et al. |
| 6,550,877 | B1 | 4/2003 | Anderson et al. |

(Continued)

FOREIGN PATENT DOCUMENTS

| CN | 202486658 | 10/2012 |
| JP | 2008134997 | 6/2008 |

OTHER PUBLICATIONS

International Searching Authority, The International Search Report and the Written Opinion, dated Dec. 23, 2014, 10 Pages.

(Continued)

*Primary Examiner* — Elias Mamo
(74) *Attorney, Agent, or Firm* — Hewlett Packard Enterprise Patent Department

(57) ABSTRACT

In one example implementation according to aspects of the present disclosure, a server chassis may include a server zone to receive a plurality of blade servers, each of the plurality of blade servers having a fabric connection. The server chassis may further include a flexible input/output zone to receive an input/output card, the input/output card being communicatively coupled to each of the plurality of blade servers via the fabric connection of each of the plurality of blade servers. The functionality of the input/output card may be distributed across the plurality of blade servers.

20 Claims, 5 Drawing Sheets

(51) Int. Cl.
    *G06F 13/40*     (2006.01)
    *G06F 1/16*     (2006.01)
    *H05K 7/14*     (2006.01)
    *G06F 1/20*     (2006.01)

(52) U.S. Cl.
    CPC ....... *G06F 13/4282* (2013.01); *H05K 7/1492* (2013.01); *G06F 1/206* (2013.01)

(56) References Cited

U.S. PATENT DOCUMENTS

| | | | |
|---|---|---|---|
| 6,594,150 | B2 | 7/2003 | Creason et al. |
| 6,771,499 | B2 * | 8/2004 | Crippen ................. G06F 1/20 16/277 |
| 6,785,133 | B2 | 8/2004 | Barringer et al. |
| 6,924,986 | B1 | 8/2005 | Sardella et al. |
| 8,031,722 | B1 | 10/2011 | Sanville et al. |
| 8,160,063 | B2 | 4/2012 | Maltz et al. |
| 8,671,153 | B1 * | 3/2014 | Chu ................. G06F 13/4022 709/213 |
| 2002/0194412 | A1 | 12/2002 | Bottom |
| 2004/0181730 | A1 | 9/2004 | Monfared et al. |
| 2006/0221579 | A1 * | 10/2006 | Liang ................. H05K 7/1445 361/724 |
| 2007/0047536 | A1 * | 3/2007 | Scherer ................. H04L 49/358 370/360 |
| 2007/0097948 | A1 | 5/2007 | Boyd et al. |
| 2008/0259555 | A1 | 10/2008 | Bechtolsheim et al. |
| 2009/0089464 | A1 * | 4/2009 | Lach ................. G06F 13/4022 710/62 |
| 2010/0106871 | A1 | 4/2010 | Daniel |
| 2011/0302346 | A1 | 12/2011 | Vahdat et al. |
| 2012/0011297 | A1 | 1/2012 | Shanghag et al. |
| 2012/0201253 | A1 | 8/2012 | Cardona et al. |
| 2012/0250679 | A1 | 10/2012 | Judge et al. |
| 2012/0321309 | A1 | 12/2012 | Barry et al. |
| 2013/0135811 | A1 | 5/2013 | Dunwoody et al. |
| 2013/0156028 | A1 | 6/2013 | Hernandez et al. |
| 2013/0322434 | A1 | 12/2013 | Armbruster et al. |

OTHER PUBLICATIONS

Dell, Dell PowerEdge C5220 Microserver, Highly efficient microserver in a shared infrastructure chassis dated on or before Feb. 20, 2014 (5 pages).

McGee, M.S., UCS Networking: Simplicity of Rack Connectivity Plus All the Benefits of Blade and Virtualization, (Web Page), Oct. 18, 2012, 8 Pages.

International Search Report and Written Opinion received for PCT Patent Application No. PCT/US2014/032950, dated Dec. 23, 2014, 8 pages.

International Search Report and Written Opinion received for PCT Patent Application No. PCT/US2014/032066, dated Dec. 11, 2014, 10 pages.

International Preliminary Report on Patentability received for PCT Patent Application No. PCT/US2014/032950, dated Oct. 13, 2016, 7 pages.

International Preliminary Report on Patentability received for PCT Patent Application No. PCT/US2014/032066, dated Oct. 6, 2016, 9 pages.

Big "switches:" little Servers—Semiconductor Update from Open Compute Summit 2014; AMCC, AMD, ARMH, INTC, (Web Page), Feb. 3, 2014, 12 Pages.

* cited by examiner

FLEXIBLE INPUT/OUTPUT ZONE IN A SERVER CHASSIS

BACKGROUND

The amount and size of electronic data consumers and companies generate and use continues to grow in size and complexity, as does the size and complexity of related applications. In response, data centers housing the growing and complex data and related applications have begun to implement a variety of networking and server configurations to provide access to the data and applications.

BRIEF DESCRIPTION OF THE DRAWINGS

The following detailed description references the drawings, in which.

DETAILED DESCRIPTION

Figure 1:
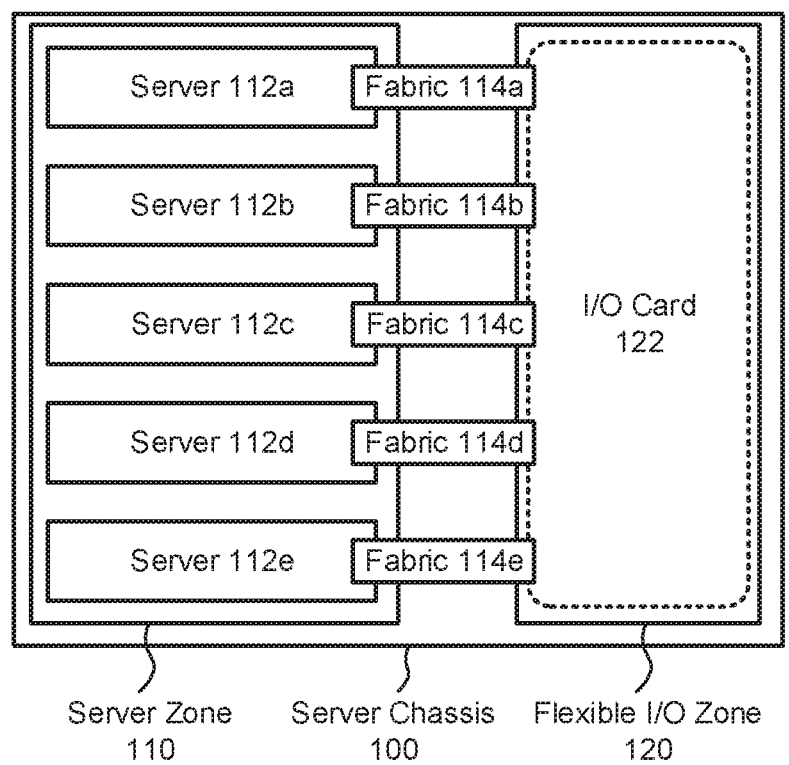
FIG. 1 illustrates a block diagram of a server chassis with a flexible input/output zone to receive an input/output card communicatively coupled to a plurality of servers within the server chassis according to examples of the present disclosure.

Customer requirements are diverse and varied within the cloud computing space. The industry is trending towards rack-scale, chassis-based solutions that offer the density of blade-like enclosures at entry level server prices. Customers want the flexibility of using industry standard input/output (I/O) adapters to take advantage of cost efficiencies, as well as have custom modular systems within their data center architectures. The server market is very dynamic, and it can be schedule and cost-prohibitive to develop multiple, individual chassis based solutions for each implementation and combination.

On-going and ever-changing cloud computing environments are making it challenging for traditional multi-rack computing infrastructures to support the ever changing and varied computing, storage, I/O, and infrastructure demands. Existing modular chassis designs have fixed I/O fabric zones which can limit the connectivity and scalability and connectivity of/between the compute, storage, and I/O resources. Compounding the limitations is the uniform connectivity/distribution of I/O fabric connectivity to each resource within the chassis which can limit the mixing of heterogeneous devices (e.g., compute/storage) within the same chassis.

Current chassis-based solutions are typically at one of two extremes. At one end of the extreme, multi-server chassis are designed so that their server trays are independent and no in-chassis resources (e.g., I/O adapters, switches, interconnect, etc.) are shared. In this case, the connectivity between modules (e.g., storage, networking, compute, etc.) is typically externally cabled. These systems enable the use of industry standard adapters and have limited I/O connectivity choices. These solutions may be optimized for chassis density, but they lack the tight integration of features and interconnect that enterprise class, modular blade systems provide.

At the other end of the extreme, within a modular chassis architecture, many tradeoffs are made in the optimization of mechanical space usage. These typically utilize custom form-factored modules (e.g., network adapters, storage adapters, network switches, etc.) that are specific to the individual chassis and its pluggable subsystems. In this case, the I/O fabric is exposed through the chassis infrastructure to an external I/O module. The external I/O module can be either a simple pass through (in the case of using a standard top-of-rack switch), or through an integrated switch module. Due to the custom form factor of the module (e.g., mezzanine adapter), it may not be economical to develop a module/mezzanine each and every customer requirement. Within such a chassis. I/O connectivity options have restrictions, and the choice of exposing fabrics externally is limited. Consequently, the chassis may be limited to a certain number of fabrics across the entire chassis, and thus its ability to support fully heterogeneous server trays is limited. The nature of the shared chassis interface modules may prevent each of the individual server tray/blade from having its own unique I/O module.

Various implementations are described below by referring to several examples of a server chassis with a flexible input/output zone to receive an input/output card communicatively coupled to a plurality of servers within the server chassis. In one example implementation according to aspects of the present disclosure, a server chassis includes a server zone to receive a plurality of blade servers, each of the plurality of blade servers having a fabric connection. The server chassis further includes a flexible input/output zone to receive an input/output card, the input/output card being communicatively coupled to each of the plurality of blade servers via the fabric connection of each of the plurality of blade servers. The functionality of the input/output card is distributed across the plurality of blade servers.

In another example implementation, a server chassis includes a server zone to receive a plurality of blade servers, each of the plurality of blade servers having a fabric connection. The server chassis further includes a flexible input/output zone to receive a first input/output card and a second input/output card, the first input/output card being communicatively coupled to a first subset of the plurality of blade servers via the fabric connection of each of the first subset of the plurality of blade servers, and the second flexible input/output card being communicatively coupled to a second subset of the plurality of blade servers via the fabric connection of each of the second subset of the plurality of blade servers. The functionality of the first input/output card is distributed across the first subset of the plurality of blade servers, and the functionality of the second input/output card is distributed across the second subset of the plurality of blade servers. These and other examples are described in detail herein.

In yet another example, a server chassis includes a flexible input/output zone to receive an input/output card, the input/ output card being communicatively coupled to at least one of a plurality of blade servers via a PCIe connection of the at least one of the plurality of blade servers. The functionality of the input/output card is distributed across the at least one of the plurality of blade servers communicatively coupled to the input/output card. In an example, the flexible input/output zone is positioned in a rear portion of the server chassis. The server chassis also includes a server zone to receive a plurality of blade servers, each of the plurality of blade servers having a PCIe connection. The server zone is positioned proximate to the flexible input/output zone.

In some implementations, the server chassis with a flexible input/output (I/O) zone provides flexibility to use common adapters. For example, adapters such as advanced local area network (LAN) on motherboard (LOM) controllers and network interface cards (including Ethernet, fiber optic over Ethernet. Infiniband, and other networking interface card types) and other similar modules as well as provides support for custom modules for Peripheral Component Interconnect Express connected devices. Additionally, different I/O adapters and solutions may be implemented on a per-server basis in addition to a chassis level basis. Heterogeneous compute/storage infrastructures and bays/trays may also be supported. Separate areas for configurable PCIe use and storage interfaces may also be provided. "Front cabled" solutions and "rear cabled" solutions may also both be supported. Moreover, the server chassis with a flexible input/output zone provides support for independent servers and connectivity to a variety of fabrics. The ability to reduce physical rack volume consumption by integrating rack level features (e.g., network switches, storage fabric switching, etc.) into the chassis is also provided. These and other advantages will be apparent from the description that follows.

FIG. 1 illustrates a server chassis 100 with a flexible input/output zone 120 to receive an input/output card 122 communicatively coupled to a plurality of servers 112*a-e* within the server chassis 100 according to examples of the present disclosure, FIG. 1 includes particular components, modules, etc. according to various examples. However, in different implementations, more, fewer, and/or other components, modules, arrangements of components/modules, etc. may be used according to the teachings described herein.

Figure 5:
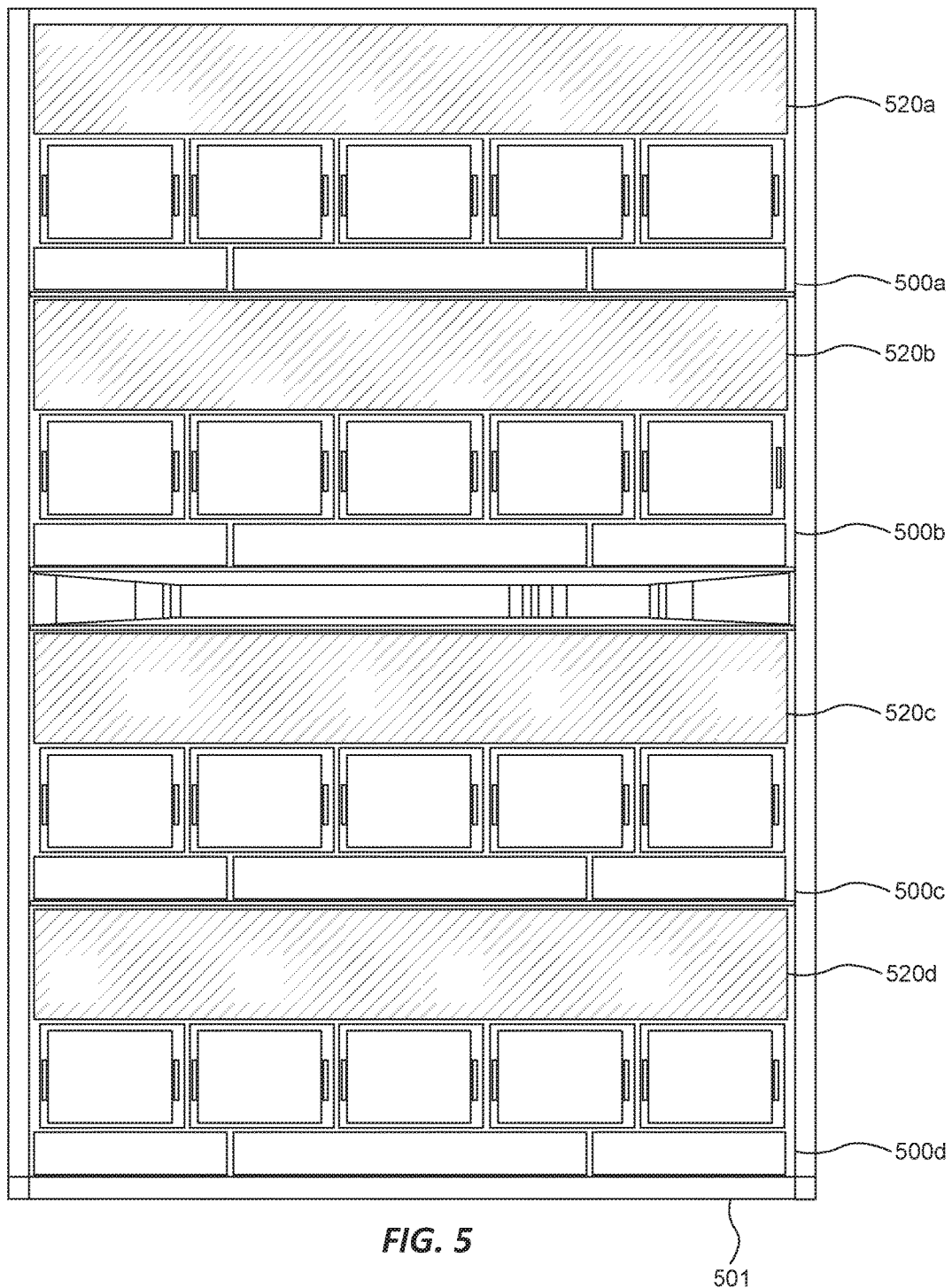
FIG. 5 illustrates a block diagram of a server rack having a plurality of server chassis, each server chassis having a server zone having a plurality of servers, and a flexible input/output zone to receive input/output cards communicatively coupled to the plurality of servers within the server chassis according to examples of the present disclosure.

The server chassis 100 may be, for example, a rack-scale infrastructure of an appropriate type, shape, and material to be stored in or connected to a server rack (shown in FIG. 5). As illustrated in FIG. 1, the server chassis 100 includes a server zone 110 for receiving a plurality of servers, such as servers 112*a-e*. Once received, the servers 112*a-e* are physically connected to the server chassis 100, either directly or through the server zone 110. The server zone 110 may be a logical area within the server chassis 100 to receive the servers 112*a-e*, in some examples, or the server zone 110 may be a physical tray, rack, or other device useful for physically coupling the servers 112*a-e* to the server chassis 110. It should be understood that, although five servers are illustrated as being received by the server zone 110 (and thus in the server chassis 100), any appropriate number of servers may be implemented in various examples.

In examples, the servers 112*a-e* may be blade servers and may be of similar or the same physical size and dimensions. The servers 112*a-e* may also be of the same configuration (homogenous) or of different configurations (heterogeneous). The servers 112*a-e* may also include components such as processors, memories, storage devices, buses, and/or other components utilized in such computing devices.

Although the term "servers" is used, it should be understood that any appropriate compute, storage, or other device, component, or cable that interfaces into the server chassis 100 may be utilized.

In some examples, the server chassis 100 may be considered to be rear cabled. That is, cables, such as power, network, video, and the like, are connected to the rear of the server chassis 100. In other examples, the server chassis 100 may be considered to be front cabled. That is, the cables are connected to the front of the server chassis 100. In examples, a rear cabled server chassis may also include some front cabling, and likewise a front cabled server chassis may also include some rear cabling.

In an example of a rear cabled server chassis, the flexible input/output zone is positioned in a rear portion of the server chassis, and wherein the server zone is positioned proximate to the flexible input/output zone. In an example of a front cabled server chassis, the flexible input/output zone is positioned in a rear portion of the server chassis, and wherein the server zone is positioned in a front portion of the server chassis.

The server chassis 100 also includes a flexible input/output (I/O) zone 120, which acts as a physical, mechanical zone within the server chassis 100. The flexible I/O zone 120 may physically receive an I/O card (or multiple I/O cards), such as I/O card 122. The flexible I/O zone 120 may receive a variety of different types and sizes of I/O cards, including network interface controller cards, storage input/output controller cards, and other input/output cards, which are accessible through a corresponding fabric within the flexible I/O zone.

In the example shown, the flexible I/O zone 120 includes a fabric, which enables the I/O card 122 to communicatively couple to the servers 112*a-e* via the fabric connections 114*a-e* respectively. For example, the flexible I/O zone 120 may support PCIe fabrics, serial attached SCSI (SAS) fabrics, flexible local area networking on motherboard fabrics, and other appropriate fabrics. Through these fabrics, the I/O card 122 may communicatively couple to the plurality of servers 112*a-e*. In this way, the type of I/O cards may vary, enabling a greater variety of options for configuring the server chassis and the servers.

Although FIG. 1 shows a single I/O card 122 as being received by (or installed in) the flexible I/O zone 120, additional I/O cards may also be received by the flexible I/O zone 120 in other examples. For example, each server 112*a-e* may receive its own I/O card (as in FIG. 3). This may be useful in front cabled implementations such that the flexible I/O zone serves as an additional I/O expansion slot for each of the plurality of servers 112*a-e*.

Figure 2:
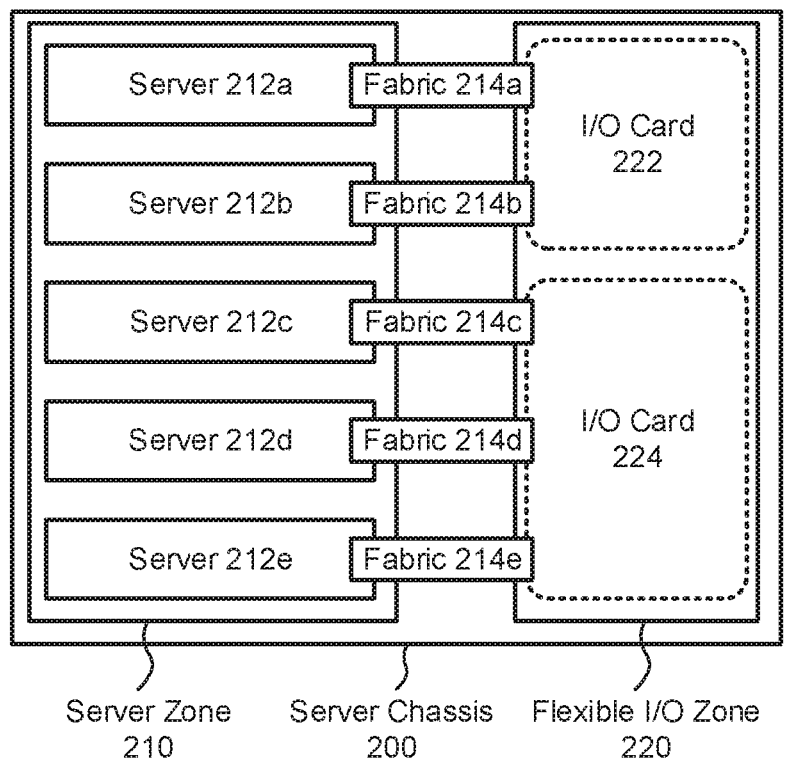
FIG. 2 illustrates a block diagram of a server chassis with a flexible input/output zone to receive input/output cards communicatively coupled to a plurality of servers within the server chassis according to examples of the present disclosure.

FIG. 2 illustrates a block diagram of a server chassis 200 with a flexible input/output zone 220 to receive input/output cards 222 and 224 communicatively coupled to a plurality of servers 212 within the server chassis according to examples of the present disclosure. FIG. 2 includes particular components, modules, etc. according to various examples. However, in different implementations, more, fewer, and/or other components, modules, arrangements of components/modules, etc, may be used according to the teachings described herein.

The server chassis 200 may be, for example, a rack-scale infrastructure of an appropriate type, shape, and material to be stored in or connected to a server rack (shown in FIG. 5). As illustrated in FIG. 2, the server chassis 200 includes a server zone 210 for receiving a plurality of servers, such as servers 212*a-e*. Once received, the servers 212*a-e* are physically connected to the server chassis 200, either directly or through the server zone 210. The server zone 210 may be a logical area within the server chassis 200 to receive the servers 212*a-e*, in some examples, or the server zone 210 may be a physical tray, rack, or other device useful for physically coupling the servers 212*a-e* to the server chassis 210. It should be understood that, although five servers are illustrated as being received by the server zone 210 (and thus in the server chassis 200), any appropriate number of servers may be implemented in various examples.

In examples, the servers 212*a-e* may be blade servers and may be of similar or the same physical size and dimensions. The servers 212*a-e* may also be of the same configuration (homogenous) or of different configurations (heterogeneous). The servers 212*a-e* may also include components such as processors, memories, storage devices, buses, and/or other components utilized in such computing devices. Although the term "servers" is used, it should be understood that any appropriate compute, storage, or other device, component, or cable that interfaces into the server chassis 100 may be utilized.

In some examples, the server chassis 200 may be considered to be rear cabled. That is, cables, such as power, network, video, and the like, are connected to the rear of the server chassis 200. In other examples, the server chassis 200 may be considered to be front cabled. That is, the cables are connected to the front of the server chassis 200. In examples, a rear cabled server chassis may also include some front cabling, and likewise a front cabled server chassis may also include some rear cabling.

In an example of a rear cabled server chassis, the flexible input/output zone is positioned in a rear portion of the server chassis, and wherein the server zone is positioned proximate to the flexible input/output zone. In an example of a front cabled server chassis, the flexible input/output zone is positioned in a rear portion of the server chassis, and wherein the server zone is positioned in a front portion of the server chassis.

The server chassis 200 also includes a flexible input/output (I/O) zone 220, which acts as a physical, mechanical zone within the server chassis 200. The flexible I/O zone 220 may physically receive an I/O card (or multiple I/O cards), such as I/O cards 222 and 224. The flexible I/O zone 220 may receive a variety of different types and sizes of I/O cards, including networking cards, which are accessible through a corresponding fabric within the flexible I/O zone.

In an example, the flexible I/O zone 220 may be divided into two different areas, such as a PCIe fabric zone and a SAS fabric zone. Consequently, the flexible I/O zone 220 may receive two different I/O cards, such as I/O card 222 and I/O card 224. In this example, the I/O card 222 may interface with the flexible I/O zone 220 via PCIe fabric connections, while the I/O card 224 may interface with the flexible I/O zone 220 via SAS fabric connections. In this example, the functionality of the first I/O card 222 is distributed across the servers to which it is connected servers 212*a,b*), while the functionality of the second I/O card 222 is distributed across the servers to which it is connected (i.e., servers 212*c-e*). Additionally, the two I/O cards 222 and 224 may each be coupled to each of the plurality of servers 212*a-e* such that the functionality of both the first I/O card 222 and the second I/O card 224 may be distributed across each of the plurality of servers 212*a-e* in an example.

In other examples, the flexible I/O zone 220 may support PCIe fabrics, serial attached SCSI (SAS) fabrics, flexible local area networking on motherboard fabrics, and other appropriate fabrics. Through these fabrics, the I/O cards 222 and 224 may communicatively couple to the plurality of servers 212*a-e*. In this way, the type of I/O cards may vary, enabling a greater variety of options for configuring the server chassis and the servers.

Although FIG. 2 shows two I/O cards 222 and 224 as being received by (or installed in) the flexible I/O zone 220, more or less I/O cards may also be received by the flexible I/O zone 220 in other examples. For example, each server 212*a-e* may receive its own I/O card (as in FIG. 3). This may be useful in front cabled implementations such that the flexible I/O zone serves as an additional I/O expansion slot for each of the plurality of servers 112*a-e*.

Figure 3:
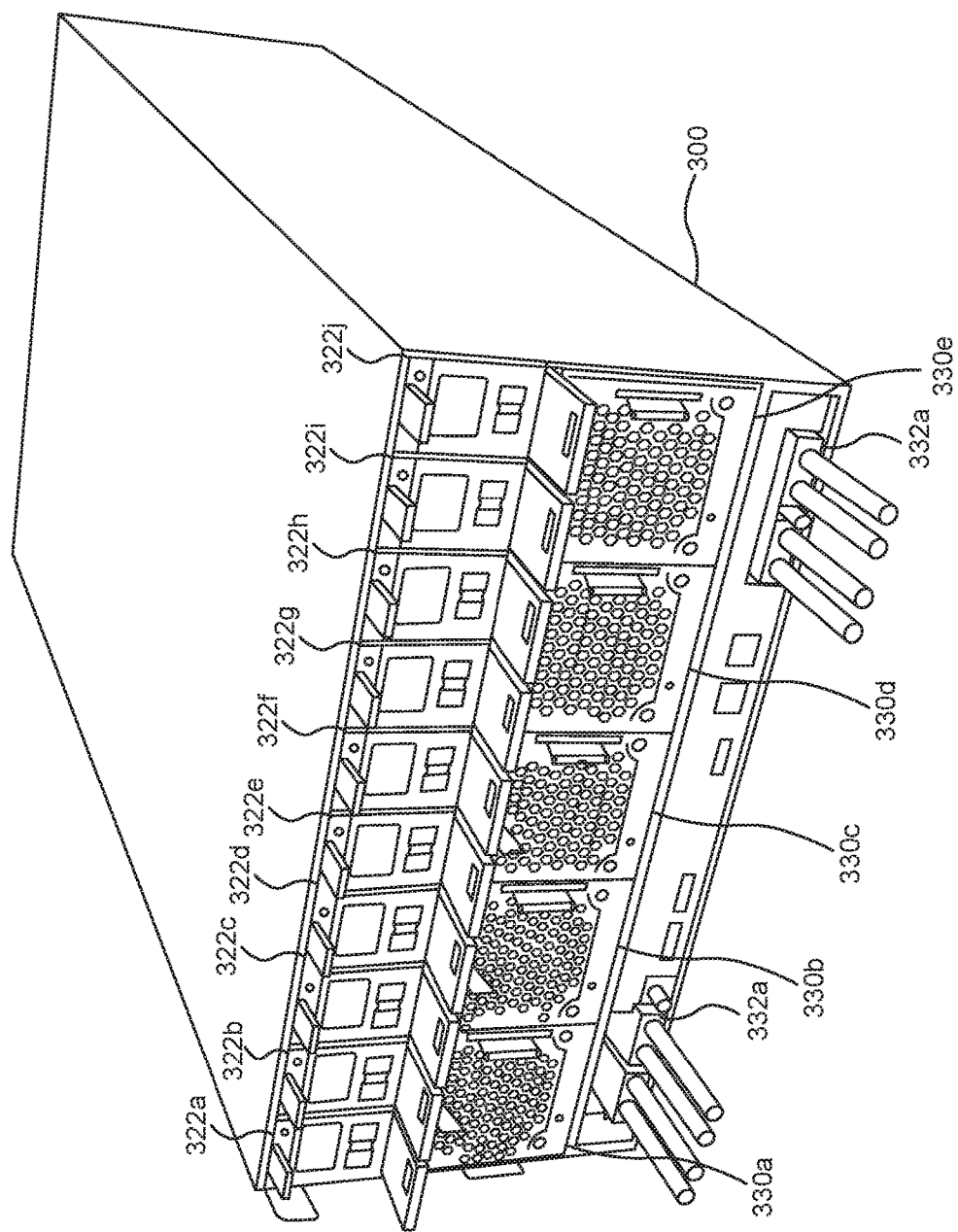
FIG. 3 illustrates a server chassis with a flexible input/output zone to receive input/output cards communicatively coupled to a plurality of servers within the server chassis according to examples of the present disclosure.

FIG. 3 illustrates a server chassis 300 with a flexible input/output zone to receive input/output cards 322*a-j* communicatively coupled to a plurality of servers within the server chassis 300 according to examples of the present disclosure. FIG. 3 includes particular components, modules, etc. according to various examples. However, in different implementations, more, fewer, and/or other components, modules, arrangements of components/modules, etc. may be used according to the teachings described herein.

In this example, the server chassis 300 is shown as enclosed chassis that includes a flexible input/output zone (not shown) and a server zone (not shown) that are internal to the server chassis 300. The server zone contains a plurality of blade servers (ten in this example), the blade servers each having a PCIe connection. The flexible input/output zone contains a plurality of input/output (I/O) cards 322*a-j*, which are each communicatively coupled to the plurality of blade servers within the server chassis 300 via the PCIe connections of each of the plurality of blade servers.

In this example, the ten I/O cards 322*a-j* may each be communicatively coupled to one of the plurality of blade servers. While each of the I/O cards may be of the same form factor, such as to be received by the flexible input/output zone, each of the I/O cards 322*a-j* may be of different types. For example, some of the I/O cards 322*a-j* may be electronic network interface controllers, some of the I/O cards 322*a-j* may be fiber optic network interface controllers, and some of the I/O cards 322*a-j* may be local area network on motherboard controllers. Other suitable types of cards with varying functionality may also be implemented in other examples.

It should be understood that the particular combinations and types of I/O cards may vary, but each of the I/O cards may be received by the flexible input/output zone to be communicatively coupled to the plurality of servers. It should also be understood that, although a one-to-one relationship between the I/O cards and the servers are depicted in this example, other relationships are possible, as discussed in this disclosure. For example, servers may share an I/O card such that the functionality of the I/O card may be distributed across the servers sharing the I/O card.

The server chassis 300 may also include power supplies such as power supplies 332*a,b*, which may be electronically coupled to each of the plurality of blade servers. Although five power supplies 332*a,b* are shown, other numbers of power supplies are possible. For example, servers may have individual power supplies or may share power supplies. The power supplies 332*a,b* may also be external to the server chassis 300 in examples. Additionally, the server chassis 300 may include cooling fans 330*a-e*, which cool the server chassis 300 and the plurality of servers by removing warm air from the server chassis 300.

Figure 4:
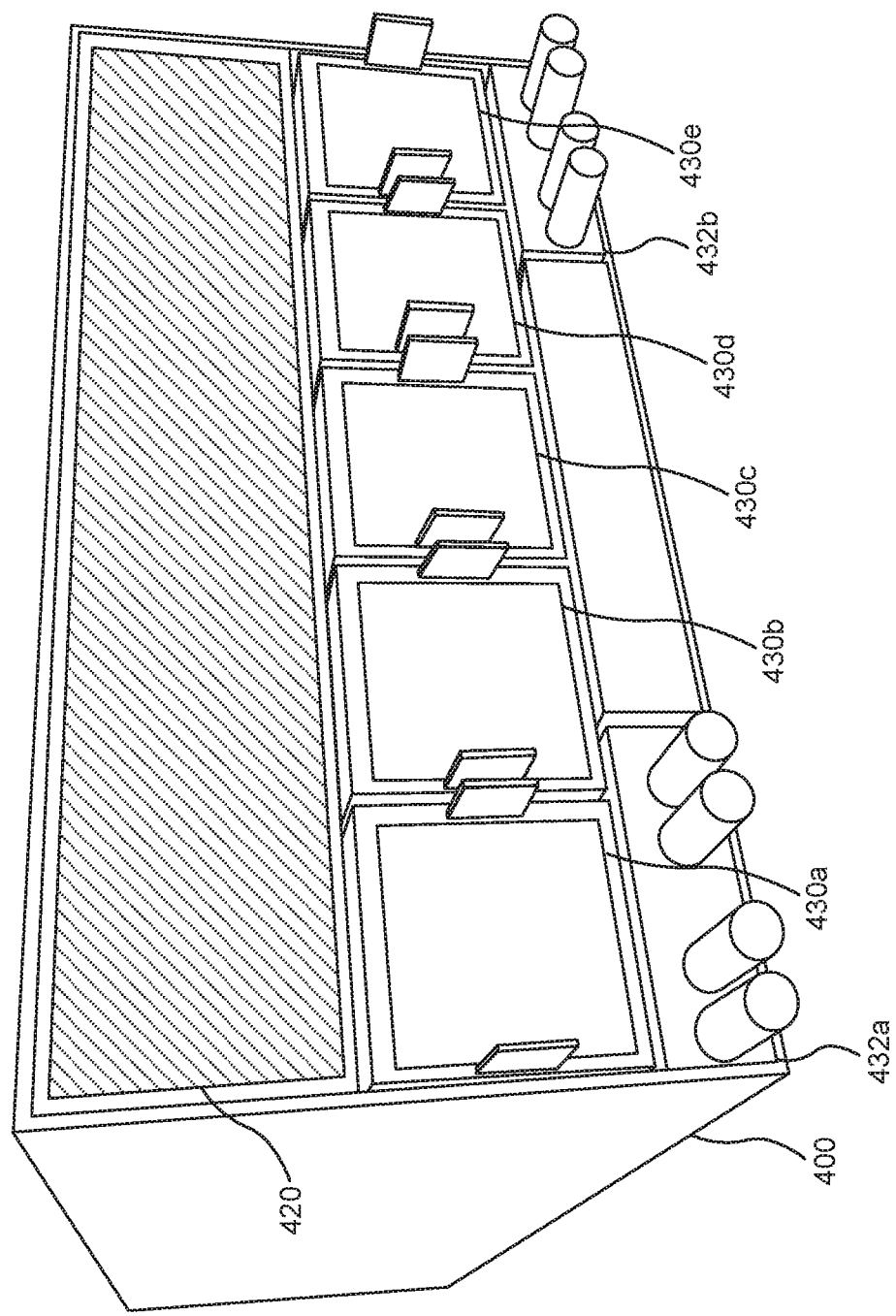
FIG. 4 illustrates a server chassis with a flexible input/output zone to receive input/output cards communicatively coupled to a plurality of servers within the server chassis according to examples of the present disclosure.

FIG. 4 illustrates a server chassis 400 with a flexible input/output zone 420 to receive input/output cards communicatively coupled to a plurality of servers within the server chassis 400 according to examples of the present disclosure. FIG. 4 includes particular components, modules, etc. according to various examples. However, in different implementations, more, fewer, and/or other components, modules, arrangements of components/modules, etc. may be used according to the teachings described herein.

In this example, the server chassis 400 is shown as enclosed chassis that includes a flexible input/output zone 420 and a server zone (not shown) that are internal to the server chassis 400. The server zone contains a plurality of blade servers, the blade servers each having a PCIe connection. The flexible input/output zone 420 may receive an input/output (I/O) card (or multiple I/O cards), which may be communicatively coupled to the plurality of blade servers within the server chassis 400 via the PCIe connections of each of the plurality of blade servers.

In this example, any appropriate number of I/O cards may each be communicatively coupled to the plurality of blade servers. While each of the I/O cards may be of the same form factor, such as to be received by the flexible input/output zone, each of the I/O cards may be of different types. For example, some of the I/O cards may be electronic network interface controllers, some of the I/O cards may be fiber optic network interface controllers, and some of the I/O cards may be local area network on motherboard controllers. Other suitable types of cards with varying functionality may also be implemented in other examples.

It should be understood that the particular combinations and types of I/O cards may vary, but each of the I/O cards may be received by the flexible input/output zone to be communicatively coupled to the plurality of servers. For example, servers may share an I/O card such that the functionality of the I/O card may be distributed across the servers sharing the I/O card.

The server chassis 400 may also include power supplies such as power supplies 432*a,b*, which may be electronically coupled to each of the plurality of blade servers. Although five power supplies 432*a,b* are shown, other numbers of power supplies are possible. For example, servers may have individual power supplies or may share power supplies. The power supplies 432*a,b* may also be external to the server chassis 400 in examples. Additionally, the server chassis 400 may include cooling fans 430*a-e*, which cool the server chassis 400 and the plurality of servers by removing warm air from the server chassis 400.

FIG. 5 illustrates a block diagram of a server rack 501 having a plurality of server chassis 500*a-d*, each server chassis 500*a-d* having a server zone having a plurality of servers, and a flexible input/output zone 520*a-d* to receive input/output cards communicatively coupled to the plurality of servers within the server chassis according to examples of the present disclosure. FIG. 5 includes particular components, modules, etc. according to various examples. However, in different implementations, more, fewer, and/or other components, modules, arrangements of components/modules, etc. may be used according to the teachings described herein.

In this example, the server rack 501 includes four server chasses 500*a-d*. Each of the server chasses 500*a-d* includes a flexible input/output zone 520*a-d* (respectively) and a server zone (not shown) that are internal to the server chassis 500*a-d*. The server zone contains a plurality of blade servers, the blade servers each having a PCIe connection. The flexible input/output zones 520*a-d* may receive an input/output (I/O) card (or multiple I/O cards), which may be communicatively coupled to the plurality of blade servers within the respective server chassis 500 via the PCIe connections of each of the plurality of blade servers.

In this example, any appropriate number of I/O cards may each be communicatively coupled to the plurality of blade servers in each of the server chassis 500*a-d*. While each of the I/O cards may be of the same form factor, such as to be received by the flexible input/output zone, each of the I/O cards may be of different types. For example, some of the I/O cards may be electronic network interface controllers, some of the I/O cards may be fiber optic network interface controllers, and some of the I/O cards may be local area network on motherboard controllers. Other suitable types of cards with varying functionality may also be implemented in other examples.

It should be understood that the particular combinations and types of I/O cards may vary, but each of the I/O cards may be received by the flexible input/output zone to be communicatively coupled to the plurality of servers. For example, servers may share an I/O card such that the functionality of the I/O card may be distributed across the servers sharing the I/O card.

In the example of FIG. 5, the server chassis 500*a-d* may be communicatively coupled together via a switch I/O card installed in each of the flexible I/O zones 520*a-d*, enabling network data to be transmitted among the plurality of servers in each of the server chassis 500*a-d* as well as among other servers in the rack 501 (if present) or among servers in other server chassis, racks, or in other locations. The switch I/O card may be in place of, or in addition to, a network interface controller card, which may also be installed in the flexible I/O zones 520*a-d*.

It should be emphasized that the above-described examples are merely possible examples of implementations and set forth for a clear understanding of the present disclosure. Many variations and modifications may be made to the above-described examples without departing substantially from the spirit and principles of the present disclosure. Further, the scope of the present disclosure is intended to cover any and all appropriate combinations and sub-combinations of all elements, features, and aspects discussed above. All such appropriate modifications and variations are intended to be included within the scope of the present disclosure, and all possible claims to individual aspects or combinations of elements or steps are intended to be supported by the present disclosure.

What is claimed is:

1. A server chassis comprising:
   a server zone to receive a plurality of servers, each of the plurality of servers having a fabric connection;
   a flexible input/output zone positioned in a rear portion of the server chassis and to receive a first input/output card, the first input/output card being communicatively coupled to a rear of each of multiple servers of the plurality of servers via the fabric connection of each of the multiple servers, wherein functionality of the first input/output card is distributed across the multiple servers; and
   a second input/output zone to receive a second input/output card communicatively connected to a front of a first server of the multiple servers, and a third input/output card communicatively connected to a front of a second server of the multiple servers, the second input/output zone positioned at a front of the server zone, and the flexible input/output zone positioned at a rear of the server zone,
   and wherein the flexible input/output zone is to further receive a fourth input/output card, wherein the multiple servers are part of a first subset of the plurality of servers, and the fourth input/output card is communicatively coupled to a rear of each of multiple servers of a second subset of the plurality of servers.

2. The server chassis of claim 1, wherein the first input/output card is a network interface controller.

3. The server chassis of claim 1, wherein the first input/output card is a storage input/output controller.

4. The server chassis of claim 1, further comprising:
a power supply electrically coupled to each of the plurality of servers; and
a cooling fan coupled to the server chassis.

5. The server chassis of claim 1, wherein the server zone is positioned in a front portion of the server chassis.

6. A server chassis comprising:
a server zone to receive a plurality of blade servers, each of the plurality of blade servers having a fabric connection;
a flexible input/output zone positioned in a rear portion of the server chassis and to receive a first input/output card and a second input/output card, the first input/output card being communicatively coupled to a rear of a first subset of the plurality of blade servers via the fabric connection of each of the first subset of the plurality of blade servers, and the second flexible input/output card being communicatively coupled to a rear of a second subset of the plurality of blade servers via the fabric connection of each of the second subset of the plurality of blade servers,
wherein functionality of the first input/output card is distributed across the first subset of the plurality of blade servers, and
wherein functionality of the second input/output card is distributed across the second subset of the plurality of blade servers; and
a second input/output zone to receive a third input/output card communicatively connected to a front of a first server of the plurality of servers, and to receive a fourth input/output card communicatively connected to a front of a second server, the second input/output zone positioned at a front of the server zone, and the flexible input/output zone positioned at a rear of the server zone.

7. The server chassis of claim 6, further comprising:
a power supply electrically coupled to each of the plurality of blade servers; and
a cooling fan coupled to the server chassis.

8. The server chassis of claim 6, wherein the first input/output card is a network interface controller, and wherein the second input/output card is a storage input/output controller.

9. The server chassis of claim 6, wherein the first input/output card is a first network interface controller, and wherein the second input/output card is a second network interface controller.

10. The server chassis of claim 6, wherein the server zone is positioned in a front portion of the server chassis.

11. A server system comprising:
a server chassis;
a server zone positioned in a front portion of the server chassis and comprising a plurality of blade servers, each of the plurality of blade servers having a fabric connection;
a first flexible input/output zone positioned in a rear portion of the chassis and comprising a first input/output card, the first input/output card being communicatively coupled to a rear of each of multiple blade servers of the plurality of blade servers via the fabric connections of the multiple blade servers, wherein functionality of the first input/output card is distributed across the multiple blade servers; and
a second flexible input/output zone positioned at a front of the server zone and comprising a second input/output card communicatively connected to a front of a first blade server of the multiple blade servers, and comprising a third input/output card communicatively connected to a front of a second server of the multiple servers, the second input/output zone positioned at a front of the server zone, and the flexible input/output zone positioned at a rear of the server zone;
and wherein the first flexible input/output zone further comprises a fourth input/output card, wherein the multiple blade servers are part of a first subset of the plurality of blade servers, and the fourth input/output card is communicatively coupled to a rear of each of multiple servers of a second subset of the plurality of servers.

12. The server system of claim 11, wherein the multiple blade servers are part of a first subset of the plurality of blade servers, the first flexible input/output zone further comprises a second input/output card, the second input/output card of the first flexible input/output zone being communicatively coupled to a rear of each of multiple blade servers of a second subset of the plurality of blade servers, wherein functionality of the second input/output card of the first flexible input/output zone is distributed across the multiple blade servers of the second subset of the plurality of blade servers.

13. The server chassis of claim 1, wherein the second input/output card and the third input/output card are of different types.

14. The server chassis of claim 1, wherein the first input/output card and the fourth input/output card are of different types.

15. The server chassis of claim 1, wherein the second input/output zone provides additional expansion functionality for the plurality of servers, in addition to expansion functionality of the flexible input/output zone.

16. The server chassis of claim 1, wherein the server chassis supports both front cabling and rear cabling, the front cabling supporting connection of a cable to a front of the server chassis, and the rear cabling supporting connection of a cable to a rear of the server chassis.

17. The server system of claim 11, wherein the second input/output card and the third input/output card are of different types.

18. The server chassis of claim 6, wherein the first input/output card and the fourth input/output card are of different types.

19. The server chassis of claim 6, wherein the second input/output zone provides additional expansion functionality for the plurality of blade servers, in addition to expansion functionality of the flexible input/output zone.

20. The server chassis of claim 6, wherein the server chassis supports both front cabling and rear cabling, the front cabling supporting connection of a cable to a front of the server chassis, and the rear cabling supporting connection of a cable to a rear of the server chassis.

* * * * *